United States Patent [19]

Fujita

[11] 3,803,462

[45] Apr. 9, 1974

[54] BILATERAL SWITCHING PRESSURE SENSITIVE SEMICONDUCTOR DEVICE

[75] Inventor: Takashi Fujita, Toyonaka-shi, Japan

[73] Assignee: Matsushita Electric Industrial Co., Ltd., Osaka, Japan

[22] Filed: Mar. 11, 1969

[21] Appl. No.: 806,203

[30] Foreign Application Priority Data

Mar. 15, 1968 Japan ............................... 43-17397

[52] U.S. Cl. ... 317/235 R, 317/235 M, 317/235 UA, 317/235 AK

[51] Int. Cl. ............................................... H01l 5/02

[58] Field of Search ............................... 317/235 M

[56] References Cited

UNITED STATES PATENTS

| | | | |
|---|---|---|---|
| 3,323,358 | 6/1967 | Fraioli | 317/235 |
| 3,432,732 | 3/1969 | Shibata et al. | 317/235 |
| 3,444,444 | 5/1969 | Yamashita et al. | 317/235 |
| 3,465,176 | 9/1969 | Tanaka et al. | 317/235 |

*Primary Examiner*—Rudolph V. Rolinec
*Assistant Examiner*—William D. Larkins
*Attorney, Agent, or Firm*—Stevens, Davis, Miller & Mosher

[57] ABSTRACT

A pressure sensitive bidirectional switching semiconductor device comprising a semiconductor substrate consisting of a semiconductive material such as silicon and of an additive of a deep energy level impurity, a surface of the semiconductor substrate having at least two projections of a mesa type, and separate electrodes provided on the surfaces of the semiconductor substrate so that the resistance measured between the separate electrodes may be varied in response to a pressure applied to the projections through the electrodes on the projections by means of a flat plate.

1 Claim, 4 Drawing Figures

INVENTOR
TAKASHI FUJITA

BY

ATTORNEYS

BILATERAL SWITCHING PRESSURE SENSITIVE SEMICONDUCTOR DEVICE

The present invention relates to semiconductor devices which function to convert mechanical or acoustic energy into an electrical energy.

Heretofore, the pressure sensitive semiconductor devices have been adapted to exhibit pressure sensitive characteristics with respect to pressure applied to electrodes on a semiconductor substrate by means of a needle or needles. In such type of devices, however, the contacts between the needles and the semiconductor substrate were feeble with respect to mechanical shock and therefore had a tendency to be damaged thereby. In addition, a possible deviation of positioning of the neeedles tended to make the characteristics of the semiconductor devices fluctuate, so that the characteristics were not stable.

The present invention is intended to provide a pressure sensitive device free from the above-mentioned drawbacks experienced with the conventional devices.

The major object of the present invention is to provide a pressure sensitive semiconductor device comprising a semiconductor substrate doped with at least one kind of a deep energy level impurity, a surface of the substrate having at least two projections of a mesa type each having a relatively high surface impurity concentration and a proper surface area, separate electrodes formed on the surfaces of the semiconductor substrate, at least one of said separate electrodes being formed on at least a portion of the projections so as to form an electric potential barrier between the at least one separate electrode and the semiconductor substrate, and a pressing means in the form of a flat plate placed on the at least one separate electrode whereby the resistance between the separate electrodes of the semi-conductor substrate is varied in response to pressure applied to the semiconductor device through the pressing means.

Other objects, features and advantages of the present invention will be readily understood from the following description when read with reference to the accompanying drawings, in which.

Figure 1:
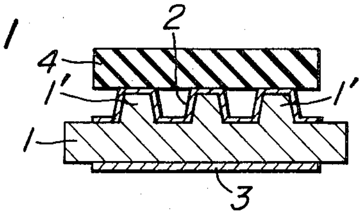
FIG. 1 is a cross-sectional view of a pressure sensitive device in accordance with an embodiment of the present invention.

Referring to FIG. 1, reference numeral 1 designates a semiconductor substrate into which has been introduced at least one of deep energy level impurities such as Au, Cu, Ni and Fe. On one surface of the substrate 1 there are formed at least two projections 1′ of a mesa type each having a relatively high surface impurity concentration and a proper surface area. Reference numeral 2 designates an electrode formed on the surface having the projections 1′ of the substrate 1 by means of, for example, vacuum evaporation. The electrode 2, consisting of an electroconductive material such as Au, Ag, Mo or W and being in contact with the semiconductor substrate 1, creates an electric potential barrier at the contact between the electrode 2 itself and the substrate 1, so that the contact exhibits non-ohmic rectifying characteristics. Reference numeral 3 designates an electro-conductive electrode in ohmic contact with the surface of the substrate 1 opposite to the surface on which the projections 1′ are provided, and reference numeral 4 designates a pressing means in the form of a flat plate consisting of an insulating material.

Figures 2, 3:
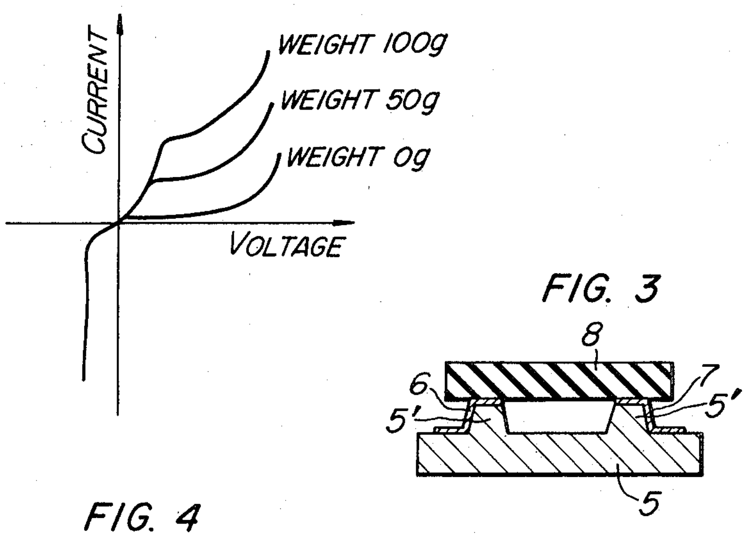
FIG. 2 is a graph showing pressure-sensitive characteristics of the device shown in FIG. 1.
FIG. 3 is a view similar to FIG. 1 in accordance with another embodiment of the present invention.

Reference will be made to the operation of the device shown in FIG. 1. A reverse bias DC voltage is applied from a suitable voltage source (not shown). For example, the positive and negative poles of the source may be connected to the electrodes 2 and 3 respectively. As illustrated in FIG. 2, when no pressure is applied by the pressing means 4, only a very low current flows between the separate electrodes 2 and 3, i.e., in the semiconductor substrate 1. Meanwhile, when pressure is applied by means of the pressing means 4, the device shows rectifying characteristics variable depending upon the applied pressure or weight. As can be understood from the illustration of current-voltage curves of the device in which the gradient of the curves, i.e., the resistance of the device varies to a considerable degree, the device is capable of serving as a unidirectional switching element responsie responsive pressure. The resistance of the device is decreased with an increase in the applied pressure.

Referring to FIG. 3 showing another embodiment of the present invention, reference numeral 5 designates a semiconductor substrate similar to the substrate 1 of FIG. 1 while reference numerals 5′ designate at least two projections of a mesa type each having a relatively high surface impurity concentration and a proper surface area and similar to the projections 1′ of FIG. 1. Reference numerals 6 and 7 designate separate electrodes formed on the projections 5′ of the semiconductor substrate 5 by means of, for example, vacuum evaporation, using an electroconductive material such as Ag, Mo or W. These electrodes 6 and 7, being in contact with the semiconductor substrate 5, also create electric potential barriers at the contacts between the electrodes 6 and 7 themselves and the substrate 5, so that the contacts exhibit non-ohmic rectifying characteristics. Reference numeral 8 designates a pressing means similar to the pressing means 4 of FIG. 1, in the form of a flat plate consisting of an insulating material.

Figure 4:
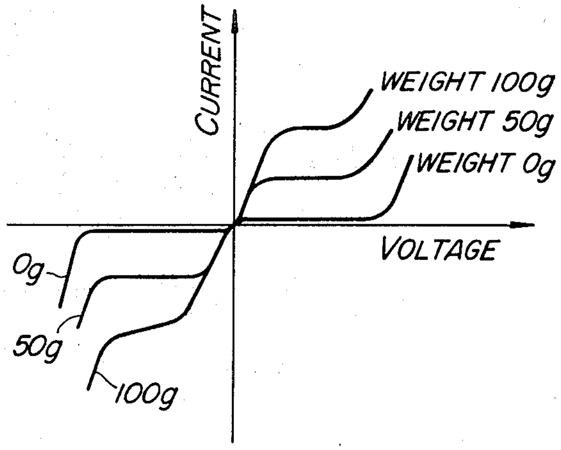
FIG. 4 is a graph showing pressure-sensitive characteristics of the device shown in FIG. 3.

In operation, the device shown in FIG. 3 exhibits bidirectional switching characteristics as illustrated in FIG. 4. An AC bias voltage is applied to the device. When no pressure is applied to the device, only a very low current flows in the device with respect to a certain range of applied voltages of the positive and negative polarities, and when pressure is applied to the device by means of the pressing means 8, the current-voltage characteristics of the device are varied depending upon the applied pressure or weight, so that the gradient of the curves, i.e., the resistance of the device is varied in response to the weight. As indicated in FIG. 4, the resistance of the device is decreased with an increase in the applied pressure. Thus, the device is capable of serving as a bidirectional switching element responsive to pressure.

As has been described above, in accordance with the present invention, since a semiconductor substrate has on its one surface a plurality of projections such that a pressing means in the form of a flat plate can be used to apply pressure to the device through the projections to vary the resitance of the device depending upon the applied pressure without making use of pressing needles as has been done conventionally, breakage of electrodes with which pressing means is in contact can be prevented and therefore the lifetime of the device is almost infinite. Further, in the present invention, the contacts between the pressing means and the semiconductor device are very stable and no deviation of the positioning of the pressing means occurs as has been experienced with the conventional device using needles, so that the pressure-sensitive characteristics are stabilized. Accordingly, a pressure sensitive semiconductor device of the present invention is used as a transducer for conversion from mechanical or acoustic energy into electrical energy, a contactless switching element or a contactless variable resistor. In addition, a pressure sensitive semiconductor device of the present invention is made so as to have either unidirectional or bidirectional characteristics according to the situation in which the device is applied.

Thus, the device of the present invention can make a great industrial contribution in the field of signal processing.

What is claimed is:

1. A pressure sensitive semiconductor device comprising a semiconductor substrate doped with at least one kind of deep energy level impurity and a pressing means in the form of a flat plate through which pressure is applied to the semiconductor device, characterized in that one surface of said semiconductor substrate is provided with a plurality of projections of a mesa type, separate metal electrodes are formed on the surfaces of said semiconductor substrate, at least one of said separate electrodes being formed on at least a portion of said projections so as to form an electric potential barrier between said at least one separate electrode and said semiconductor substrate, and said pressing means is placed on said at least one separate electrode whereby the resistance between said separate electrodes of said semiconductor substrate is varied in response to pressure applied to the semiconductor device through said pressing means, wherein said separate electrodes are constituted by separate electrodes formed on that surface of said semiconductor substrate which is provided with said projections whereby the semiconductor device possesses bidirectional switching characteristics.

* * * * *